United States Patent
Bore et al.

(10) Patent No.: US 9,041,577 B2
(45) Date of Patent: May 26, 2015

(54) DIGITAL-TO-ANALOGUE CONVERTER

(71) Applicant: E2V Semiconductors, Saint Egreve (FR)

(72) Inventors: François Bore, Revel (FR); Marc Wingender, Saint Egreve (FR); Emmanuel Dumaine, Sassenage (FR)

(73) Assignee: E2V Semiconductors, Saint-Égreève (FR)

( * ) Notice: Subject to any disclaimer, the term of this patent is extended or adjusted under 35 U.S.C. 154(b) by 0 days.

(21) Appl. No.: 14/350,698

(22) PCT Filed: Oct. 8, 2012

(86) PCT No.: PCT/EP2012/069828
§ 371 (c)(1),
(2) Date: Apr. 9, 2014

(87) PCT Pub. No.: WO2013/056997
PCT Pub. Date: Apr. 25, 2013

(65) Prior Publication Data
US 2014/0253356 A1    Sep. 11, 2014

(30) Foreign Application Priority Data
Oct. 21, 2011 (FR) .................................... 11 59577

(51) Int. Cl.
*H03M 1/66* (2006.01)
*H03M 1/74* (2006.01)
*H03M 1/08* (2006.01)

(52) U.S. Cl.
CPC ............ *H03M 1/745* (2013.01); *H03M 1/0863* (2013.01); *H03M 1/0881* (2013.01)

(58) Field of Classification Search
CPC .............................. H03M 1/745; H03M 1/747

USPC .......................................... 341/136, 144, 153
See application file for complete search history.

(56) References Cited

U.S. PATENT DOCUMENTS 6,433,722 B1 * 8/2002 Gata et al. ...................... 341/144
6,559,784 B1 * 5/2003 Schofield et al. ............. 341/144

(Continued)

FOREIGN PATENT DOCUMENTS

JP             344216 A        2/1991

OTHER PUBLICATIONS

Myung-Jun Choe et al: "A 1.6GS/s 12b return-to-zero GaAs RF DAC for multiple Nyquist operation", Solid-State Circuits Conference, 2005. Digest of Technical Papers. ISS CC. 2005 IEEE International San Francisco, CA, USA Feb. 6-10, 2005, IEEE, Piscataway, NJ, USA.

(Continued)

*Primary Examiner* — Brian Young
(74) *Attorney, Agent, or Firm* — Lowe Hauptman & Ham, LLP

(57) ABSTRACT

The invention relates to digital-to-analog converters for converting current. The converter includes a pair of differential branches with two transistors controlled by a digital register activated at a clock frequency, and two resistive loads receiving the currents of the differential branches to produce a differential electrical signal representing the analog result of the conversion. The converter includes a dual switching circuit for the currents of the differential branches: a first switching circuit enables the transmission of the currents of the differential branches toward the loads for 70% to 95% of the clock period and shunts these currents outside the loads for the rest of the time; a second switching circuit alternately and symmetrically makes a direct link followed by a cross link between the differential branches and the loads. The converter provides a signal with high spectral purity and can work with a good level of power in the four Nyquist zones of the spectrum of the output analog signal, and notably in the second and third zones.

11 Claims, 4 Drawing Sheets

(56) References Cited

U.S. PATENT DOCUMENTS 6,593,869 B1 * 7/2003 Elliott .......................... 341/154
7,042,379 B2 * 5/2006 Choe ............................ 341/144
2006/0022856 A1 2/2006 Choe

OTHER PUBLICATIONS

International Search Report for PCT/EP2012/069828 dated Jan. 16, 2013.

* cited by examiner

DIGITAL-TO-ANALOGUE CONVERTER

FIELD

The invention relates to digital-to-analog converters for converting current. Current converters comprise a plurality of current sources having identical or weighted values, preferably weighted in order to reduce the size of the circuit; the digital signal to be converted is a binary word whose bits are used to control the different sources individually to enable or prevent the flow of current from each source toward a common load; the load acts as an analog adder, since the voltage developed at the terminals of the load depends on the sum of the injected currents and represents an analog value of the input binary word.

In practice, each current source supplies a pair of differential branches, namely an odd branch and an even branch; each branch includes a respective transistor, the collector current representing the current of the branch; the two transistors are controlled, respectively, by an input bit and its complement. Consequently, one of the transistors is conducting while the other is blocked, and vice versa, depending on the value of the input bit. The load of the odd branch is common to all the odd branches, and the load of the even branch is common to all the even branches.

BACKGROUND

Among the problems arising with this type of converter, it has been found that the switching of the transistors at the moment of a change of binary word introduced a significant switching noise. The switching is simultaneous (under the control of a clock) for all the transistors. However, the response times of the different transistors are widely dispersed. Furthermore, the overall response time depends to a significant extent on the difference between two consecutive binary words to be converted. As the frequency F of the clock for timing the digital data elements increases, the linearity of the converter and the spectral purity of the output signal are degraded.

Moreover, the power spectrum of the output signal is limited by the clock frequency used in this switching. This spectrum (the power of the output signal as a function of frequency) is theoretically a curve with multiple lobes in the form of sine (x)/x, having a very high attenuation around the clock frequency, and a peak at a frequency of one and a half times the clock frequency. It is therefore difficult to obtain an output signal at a sufficient level for some frequency ranges, notably around the clock frequency, and it is difficult to obtain an output signal at a level independent of the frequency within the desired frequency range.

There has already been a proposal, in US2006/0022856 for example, for an improvement in which a clock half-period is used to prevent the flow of the current toward the load during the moment when the binary word is switched at the input. The flow of current toward the load is enabled again during the next half-period when the new binary word is well established at the input of the converter.

For example, assuming that the input word is introduced into a buffer register (or "latch") actuated by a regular clock CLK, CLKb, where CLK represents an active level of the clock during a half-period and CLKb represents a complementary level which is inactive during the next half-period, provision is made to load the buffer register with a new binary word on the falling edge of CLK, to then prevent the flow of current during the half-period CLKb=1 following this falling edge, and to enable the flow of current again during the following half-period CLK=1, the new binary word then being well stabilized. More precisely, the prevention of the flow of current consists in shunting the current away from the resistive loads without interrupting this current in the transistors of the even and odd branches.

Converters of this type are called RTZ converters, that is to say return-to-zero converters, because the analog output signal periodically passes through zero during the half-periods CLKb, where CLK=0.

On the one hand, the spectral purity of the output signal is improved because the suppression of the switching dispersions of the current sources, and on the other hand the spectrum of the output signal is then better distributed and has no troughs in the vicinity of the clock frequency. However, the power of the output signal is lower.

Converters which operate in a complementary way during the two half-periods of the clock frequency have also been proposed. During the first half-period, the transistor currents of the odd differential branches are sent to an odd load and the currents of the even differential branches are sent to the even load. During the next clock half-period, the links between the transistors and the loads are crossed, sending the currents of the odd branches toward the even load and vice versa; thus the converter output signal transmits two successive complementary analog values (the one representing the binary word and the one representing the complementary word) during two successive half-periods of the clock signal. This is, in a manner of speaking, a supplementary modulation of the analog output signal, which is decoded at the time of use. The power of the output signal is, in a manner of speaking, doubled, and the output spectrum is also changed, particularly by reinforcing the power for frequencies located between half the clock frequency and the clock frequency, and even beyond.

Evidently, this switching mode, in which the current from the sources must be sent toward the load during each of the clock half-periods, is incompatible with the RTZ mode, in which the current must be shunted away from the load (toward the power supply) during this half-period.

SUMMARY

One object of the invention is to obtain both a high spectral purity of the output signal and a higher output power than that allowed by the prior art, over a wide frequency range extending beyond twice the clock frequency that defines the refresh rate of the digital input signal.

For this purpose, the invention proposes the use of a return-to-zero mode during a shorter fraction of time than the clock half-period, and the division of the rest of the clock period into two half-times during which the links between current sources and loads are alternately direct and cross links.

The invention therefore proposes a digital-to-analog converter having at least a set of current sources, a respective pair of differential branches with two transistors connected to each current source, a register activated at a clock frequency F and receiving a digital data element to be converted, the register controlling the transistors of the branches to switch the currents from the current sources individually into one or other of the differential branches of each pair as a function of the value of the digital data element to be converted, and a pair of resistive loads receiving the currents of the differential branches to produce a differential output electrical signal whose analog value represents the digital data element to be converted, the converter also having a switching circuit interposed between the differential branches and the loads, in order either to enable the transmission of the currents of the differential branches toward the loads or to shunt these currents away from the loads, characterized in that:

the switching circuit comprises means for establishing shunting periodically at the clock frequency, followed by an enabling operation, the duty cycle between the enabling time and the clock period being in the range from 0.7 to 0.95, the switching circuit comprises a switching stage allowing either a direct link or a cross link between the differential branches and the loads, and means for controlling the switching stage to connect the differential branches to the inputs of the loads directly during a first half of the enabling time and in a crossed manner during the second half of the enabling time, so as to reverse the sign of the electrical output signal between the two halves of this time.

The switching circuit therefore provides two different functions, these two functions being preferably provided by two superimposed stages between the differential branches and the adding means. The first function (enabling operation of transmission or shunting) is provided by a first switching stage, and the second function (direct or cross link) is provided by a second switching stage. The stages may be placed one after the other in a sequence or in the reverse sequence from the differential branches toward the adding means, the first stage being preferably interposed between the differential branches and the second stage.

A two-stage switching circuit is preferably common to a plurality of pairs of differential branches (but preferably not to all of them; that is to say, the converter will have a plurality of switching circuits, each associated with one group of pairs of differential branches), the differential branches common to one group then being joined at the input of the switching circuit associated with this group.

The switching circuits have pairs of transistors associated with each differential branch to provide symmetrical switching for the currents of the two differential branches. Identical auxiliary current sources are preferably connected between the switching circuit and a power supply terminal to cause a non-zero current to flow even in those current sources of the pairs of transistors of the switching circuit that are connected to a differential branch through which no flow of currents.

The time alignment between the transition edges of the signals controlling shunting and the clock signals is preferably adjustable, as is the time alignment between the transition edges of the signals controlling the crossing between the differential branches and the loads.

The invention is particularly useful when the set of current sources comprises current sources having values weighted according to a binary weighting: the weighting causes a high dispersion of the response times of the transistors of the various differential branches, but the invention allows the disadvantages of this dispersion to be compensated.

BRIEF DESCRIPTION OF DRAWINGS

Other characteristics and advantages of the invention will be revealed by the following detailed description, which refers to the attached drawings, in which.

DESCRIPTION OF EMBODIMENTS

Figure 1:
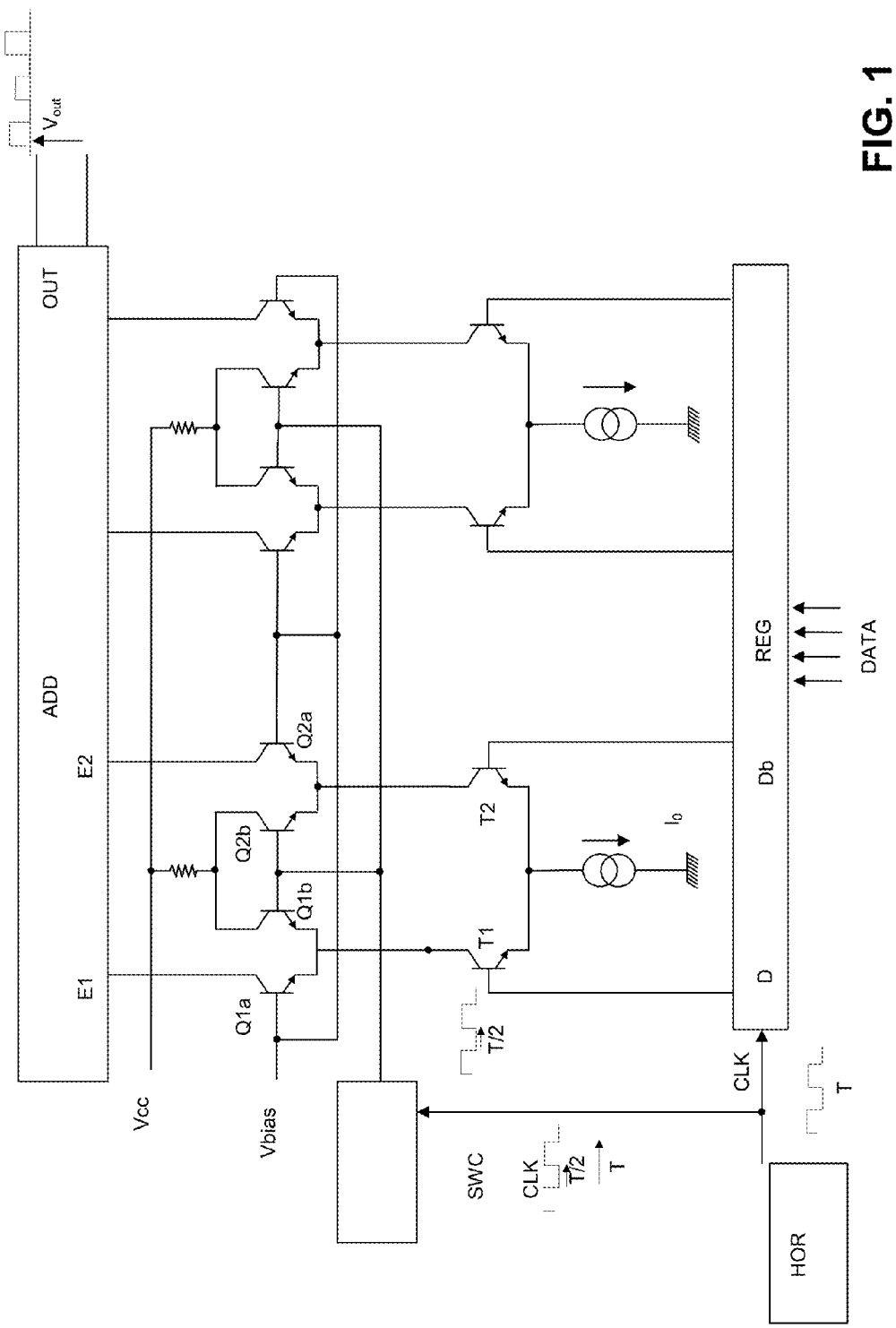
FIG. 1 shows part of a digital-to-analog converter according to the prior art.

FIG. 1 shows, in a simplified form, the principle of a return-to-zero converter according to the prior art.

A digital register REG receives a digital data element to be converted, in the form of a binary word. The register includes two outputs for each bit, respectively an odd output supplying the bit and an even output supplying its complement. The converter has a number of parallel sections equal to the number of bits in the word to be converted. Only two sections of the converter are shown, corresponding to two bits of the register. Only one section, corresponding to an output bit D and its complement Db, will be described in detail. The outputs of the different sections are current outputs; for each section, there is an odd output E1 and an even output E2; these are complementary; the odd output supplies a current (here, an input current sent toward the differential branches) if the corresponding register bit is set to 1, and supplies no current if the register bit is set to zero; the even output does the reverse.

The output currents of the different sections are weighted according to the weight assigned to each bit of the word to be converted. The internal current sources of each section therefore have their values weighted accordingly.

The currents from the odd outputs are added in an adder circuit ADD; the currents from the even outputs are also added separately in this circuit. The addition may be carried out simply by means of a load resistance which receives all the currents from the odd outputs and another load resistance which receives all the currents from the even outputs. The difference $V_{out}$ between the voltages at the terminals of these resistances is a differential analog voltage representing the digital value of the binary word to be converted. This difference is supplied on an output OUT of the adder circuit ADD.

The section corresponding to a bit of the word to be converted comprises a conventional pair of differential branches supplied with a common current drawn from a current source $I_0$. The odd branch includes a transistor T1 made to conduct by a bit 1 in the register (that is to say, a bit 1 on the odd output of the register) and blocked by a bit 0 in the register. The even branch includes a transistor T2 made to conduct by a bit 0 in the register (therefore a bit 1 on the even output of the register) and blocked by a bit 1 in the register.

The collector currents of these transistors would be applied directly to the adder circuit in the case of a non-return-to-zero converter.

In this case, the converter of FIG. 1 is a return-to-zero converter. It includes a switching circuit for allowing the currents to flow toward the adder circuit or, conversely, for shunting them toward a power supply terminal. The odd differential branch allows its current (if it exists, that is to say if the register contains a bit 1) to flow toward a first two-transistor switching circuit Q1a and Q1b; the even branch allows its current, if present, to flow toward a second two-transistor switching circuit Q2a, Q2b controlled at the same time as the first switching circuit.

The control of the switching circuits, common to the whole converter, is a circuit SWC that receives a symmetrical periodic clock signal CLK at a frequency F delivered by a clock circuit HOR. The switching circuits are in a first state during the half-period when CLK=1 and in a second state during the half-period when CLK=0. It should be noted that CLKb is the complement of the signal CLK.

The two states of the switching circuits are controlled by the circuit SWC in synchronization with the half-periods CLK and CLKb; the register is also loaded with a new digital data element in each clock period under the control of the signal CLK; for example, the falling edge of the signal CLK triggers the carrying of a new binary word (present at the input of the register) to the outputs of the register, to replace the preceding binary word.

The stabilization of this carrying and the stabilization of the currents leaving the differential branches take a certain amount of time, this time not necessarily being the same for all the sections of the converter, because the current values differ according to the sections: if the sections all have the same weight in current, there is a degree of dispersion of the current values, but, above all, if the sections are weighted in a binary way, the current values are intrinsically different.

Consequently, throughout the half-period when CLK=0, the switching circuits are put into a first state in which the transistors Q1b and Q2b are conducting and shunt the current from the differential branches toward the power supply Vcc of the circuit. The output of the circuit SWC therefore controls the transistors Q1b and Q2b.

Conversely, throughout the half-period when CLK=1, the switching circuits are put into a second state by blocking the transistors Q1b and Q2b, preventing any shunting of the current; the transistors Q1a and Q2a are normally conducting; they could be controlled by a complementary output of the circuit SWC, but in the example given their bases are brought to a fixed potential Vbias which makes them conducting. The current then flows through the transistor Q1a or the transistor Q2a, depending on the bit present in the register REG. This current is therefore used by the adder ADD.

The differential output voltage $V_{out}$ is a voltage whose value represents the input binary word during the half-period CLK=1, and which returns to zero during the other clock half-period.

Figure 2:
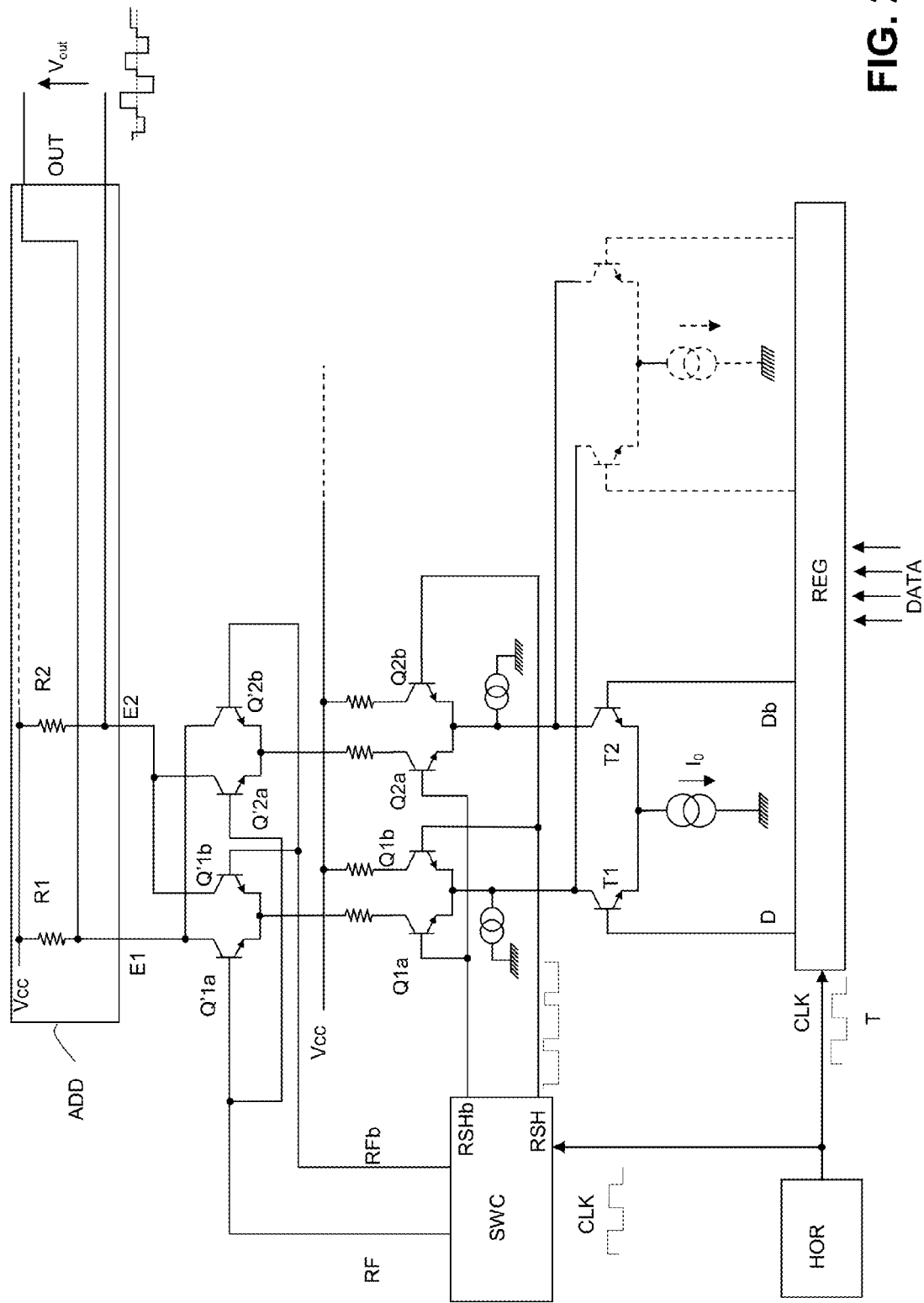
FIG. 2 shows the composition of a converter according to the invention.

FIG. 2 shows the modification according to the invention. The general structure of the converter with a section for each bit of the register is retained; the currents of the different sections are preferably weighted in a binary manner. However, instead of having a single switching stage (with two switching circuits) as in FIG. 1, the section comprises two switching stages superimposed (that is to say, in series) between the differential branches (represented by the collectors of the transistors T1 and T2) and the adder circuit ADD.

The elements common with FIG. 1 have the same reference numerals and the same functions; they will not be described again.

The first switching stage includes the transistors Q1a and Q1b for the odd differential branch and the transistors Q2a and Q2b for the even branch. It has the same function as in FIG. 1, namely to enable the flow of the current from the differential branches toward the adder circuit, or conversely to shunt this current toward the power supply Vcc.

The adder circuit ADD may be formed simply by two identical load resistances R1 and R2 supplied by the supply voltage Vcc. It comprises two inputs E1 (which will be called the odd input) and E2 (the even input). Each of the inputs receives a current from a differential branch of the pair of branches of the section represented.

A two-stage switching circuit is preferably common to a plurality of pairs of differential branches (but preferably not to all of them; that is to say, the converter will have a plurality of switching circuits, each associated with one group of differential branches); the differential branches of one group are then joined at the input of the switching circuit associated with this group, meaning that all the collectors of the even pairs of this group are connected together and all the collectors of the odd branches are connected together.

This is shown in FIG. 2: the differential branches of other sections of the converter are connected to the differential branches of the first section in such a way that the switching circuits are common to all the sections (or at least common to a group of several sections). The odd differential branch is then actually formed by the joining of all the odd differential branches of a group of several sections, and the even branch is formed by the joining of all the even branches of this group. The adder circuit ADD then essentially acts as a current to voltage converter, to produce a voltage proportional to the sum of the currents of the branches having the same parity. This is why simple resistive loads R1 and R2 may be sufficient for the construction of the adder. The other groups of sections of the converter are connected to these same resistive loads through the same inputs E1 and E2.

The differential output OUT supplies a voltage $V_{out}$ which is the difference between the voltages at the terminals of the two loads.

The enabling operation and shunting of the current are controlled by the circuit SWC which supplies two complementary signals RSH and RSHb on its two outputs. The signal RSH controls the transistors Q1a and Q2a of the first switching stage; the signal RSHb controls the transistors Q1b and Q2b of this first stage. The flow of the current is enabled by RSH at the high level, making the transistors Q1a and Q2a conducting, and simultaneously by RSHb at the low level, blocking the transistors Q1b and Q2b. The shunting is controlled by RSHb at the high level, blocking the transistors Q1a and Q2a, and by RSH at the low level, making Q1b and Q2b conducting. By contrast with the control system described with reference to FIG. 1, the durations of the high levels of RSH and RSHb on the outputs of the circuit SWC are not equal to a half-period. On the contrary, the duty cycle between the duration of the signal enabling the flow of current (RSH=1) and the clock period CLK is in the range from 0.7 to 0.95.

Figure 3:
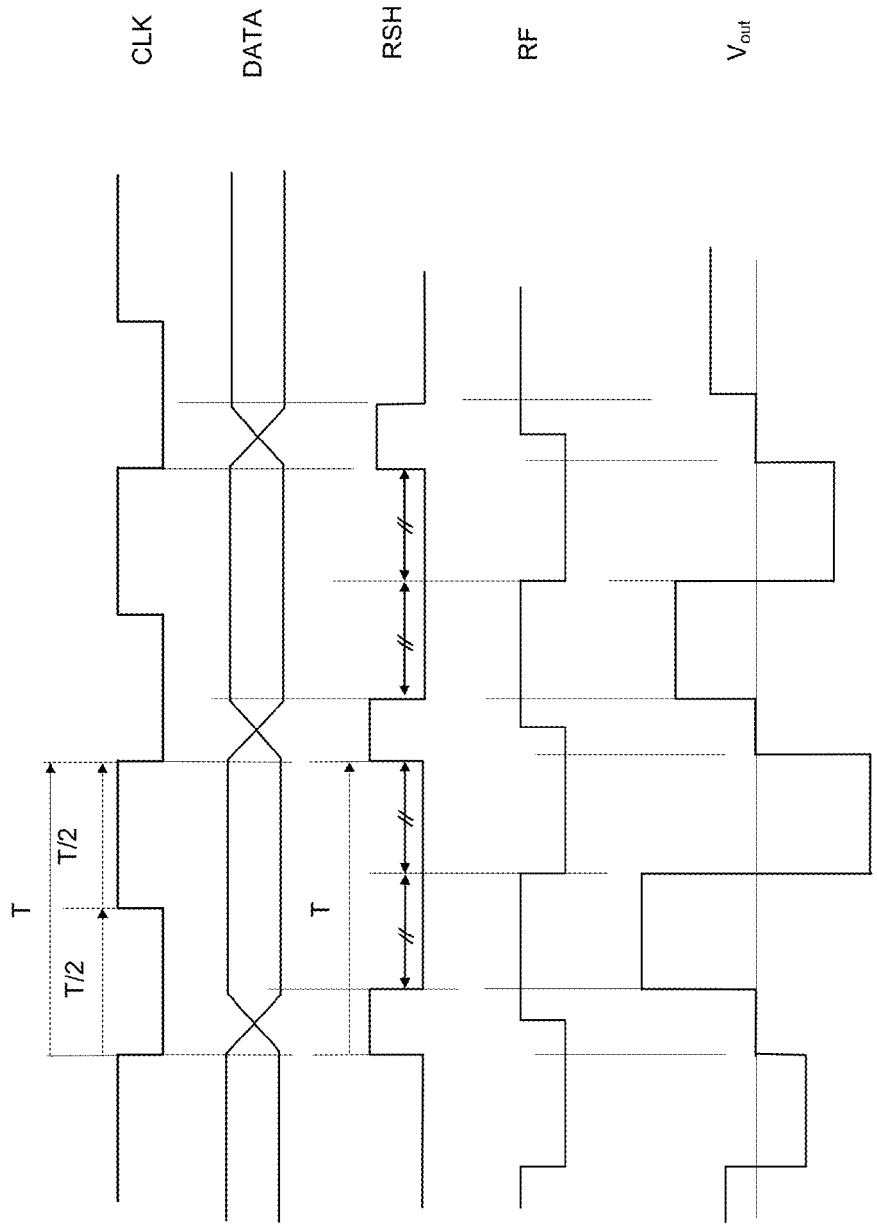
FIG. 3 shows a timing chart of the operation of the converter.

The timing chart of FIG. 3 shows the asymmetrical signal RSH in relation to the symmetrical clock CLK with period T.

The transition edges of the signals RSH and RSHb are aligned with the edges of the clock signal in such a way that the transmission of current to the adder circuit is enabled only when the logic levels at the output of the register REG are well stabilized. The signal RSH preferably passes through the high level at the moment of the falling edge of CLK. However, it falls back to the level 0 after a duration in the range from 0.05 to 0.3 times the clock period.

The circuit of FIG. 2 also shows a second switching stage comprising two transistors Q'1a and Q'1b for the odd differential branch and two transistors Q'2a and Q'2b for the even differential branch. When the currents of the differential branches are not shunted toward the power supply by the first stage, they pass through this second stage.

The second switching stage serves to switch the current of the odd differential branch alternately toward the odd input E1 (this will be called a "direct" connection) and then toward the even input E2 (this will be called a "cross" connection) and, vice versa, to switch the current of the even differential branch alternately toward the even input E2 (direct connection) and then toward the odd input E1 (cross connection).

For this purpose, the transistor Q'1a is connected between the transistor Q1a (output of the first switching circuit) and the input E1, the transistor Q'1b is connected between the transistor Q1a and the input E2, the transistor Q'2a is connected between the transistor Q2a and the input E2, and finally the transistor Q'2b is connected between the transistor Q2a and the input E1.

The transistors Q'1a and Q'2a receive the same control signal RF and the transistors Q'1b and Q'2b receive a complementary signal RFb. The signals RF and RFb are periodic at the period of the clock frequency. Their phase is aligned with respect to the enabling signal supplied by the circuit SWC so as to have a change of level transition in the middle of the duration of the enabling signal, as shown on the timing chart of FIG. 3. In the illustrated example, the duration of the high level of RF (and similarly that of RFb) is equal to a clock half-period, since this is the simplest way of implementing the signals RF and RFb, but the important point is that the enabling duration (RSH at level 1) is divided into two equal parts with, respectively, RF=1 in the first part and RF=0 in the second.

Thus,
outside the enabling signal, the current of the differential branches does not flow at all toward the adder circuit ADD;
during the first half of the enabling signal, the connection between the differential branches and the adder circuit is direct;
during the second half of the enabling signal, having the same duration as the first half, the connection is a cross connection.

The output OUT of the converter supplies a voltage signal modulated at the clock frequency and the modulation is symmetrical because, owing to the cross linking, this output supplies an analog voltage whose level represents, alternately, the binary word and its complement; the time during which a voltage representing the binary word is supplied is from 0.35 times T to 0.47 times T, where T is the clock period; the time during which a voltage representing the complement of the binary word is supplied has the same value.

The timing chart of FIG. 3 shows the sequencing of the control signals; the lines on the timing chart are as follows:
symmetrical clocksignal CLK with period T, the falling edge (in this example) defining the instruction to change the state of the outputs of the register REG to apply a new binary word to the differential branches;
DATA: the state of the register outputs, with a level establishment time on these outputs after the falling edge of the clocksignal;
RSH, the control signal of the first switching stage; its period is T; the duration of the high peaks of RSH is in the range from 0.05T to 0.3T; the duration of the low peaks is in the range from 0.95T to 0.7×T; the rising edge of RSH preferably coincides with the falling edge of the clocksignal CLK and the high peak of RSH lasts long enough for the outputs of the register to be stabilized;
RF, the control signal of the second switching stage, with the same period T as the clock; the transition from the high level to the low level is located in the middle of the interval in which RSH is at the low level;
$V_{out}$, the modulated analog voltage at the output of the converter.

This configuration of switching control signals neutralizes the risks of undesirable transitions at the output of the register at the moment of a change of binary word at the input of the converter. This provides a high spectral purity of the output signal. Furthermore, a high power of the analog signal at the converter output is retained in a spectral band around the clock frequency.

If the spectral domain is subdivided into four Nyquist zones, which are, respectively:

the frequencies 0 to F/2, where F is the clock frequency CLK;
the frequencies F/2 to F;
the frequencies F to 3/F2;
the frequencies 3/F2 to 2F,
a very good level of power is provided in the second and third zones, which would not be the case with the conventional solutions. It is even possible to have an acceptable level of power in much of the fourth Nyquist zone.

The choice of the duration of the shunting of the current toward the power supply is dependent on the switching performance of the register and of the transistors T1 and T2 of the differential branches. This is because the shunting must take place until the new states of conduction of the differential branches are firmly established. It has been found that the duration of shunting can be within the range from 5% to 30% of the clock period T, even if the current sources of the differential branches are binary weighted (an unfavorable case in terms of the dispersion of the values of the currents from the different sources).

The alignment of the transition edges of the RSH and RF signals is preferably adjustable, and this is the case individually for each of the groups if there is a plurality of groups. Similarly, the duration of the shunting is preferably adjustable individually for each of the groups if there is a plurality of groups.

Identical auxiliary current sources are preferably connected to the collectors of the transistors T1 and T2 of the differential branches, to cause a non-zero current to flow even in those collectors of the pairs of transistors of the switching circuit that are connected to a differential branch through which no flow of currents. This enables the variations of potential of the collectors of the transistors T1 and T2 to be limited (these potentials vary as a function of the values of binary words). Thus it is possible to avoid excessively high imbalances of base-emitter voltages of the transistors of the different pairs of transistors of the switching circuits. The value of the current of these auxiliary sources may be about 20% of the sum of the currents of the differential branches associated with the same switching circuit.

In a variant embodiment, the second switching stage, which serves to cross and uncross the links between the differential branches and the adder circuit, is not placed between the first stage and the resistive loads of the adder circuit, but between the differential branches and the first stage which enables or shunts the current.

Figure 4:
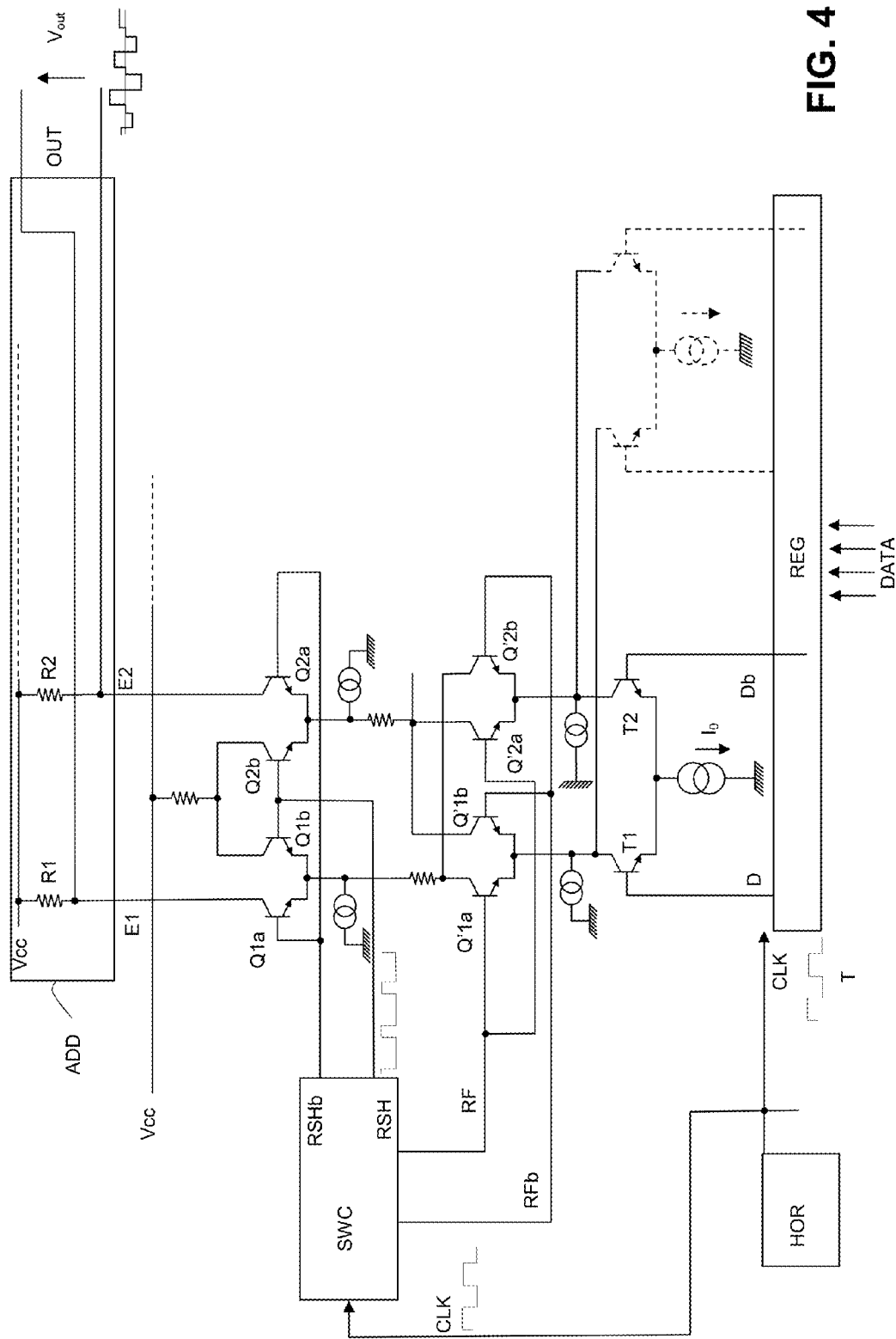
FIG. 4 shows the composition of a converter according to another embodiment.

FIG. 4 shows an exemplary embodiment of this variant. The pair of transistors Q'1a, Q'1b of the second switching circuit is connected directly to the collector of the transistor T1; the pair of transistors Q'2a, Q'2b is connected to the collector of the transistor T2.

The transistors Q'1a and Q'2a are made conducting by the signal RF at the high level, and then switch the current from the transistor T1 toward the pair Q1a, Q1b of the first switching stage, and from there toward the input E1 outside the resetting periods; they simultaneously switch the current from the transistor T2 toward the pair Q2a, Q2b of the first switching stage and from there toward the input E2 outside the resetting instants.

The transistors Q'1b and Q'2b are made conducting by the signal RFb at the high level, and then cross the links: they switch the current from the transistor T1 toward the input E2 through the pair of transistors Q2a, Q2b, and switch the current from the transistor T2 toward the input E1 through the pair Q1a, Q1b.

In the circuit of FIG. 4, auxiliary current sources connected to the collectors of the transistors T1 and T2 are preferably provided, as in FIG. 2.

Other auxiliary current sources may also be provided, in both the circuit of FIG. 2 and that of FIG. 4, at the junction points between the first and second switching circuits. In the circuit of FIG. 2, they would be connected to the emitters of the pairs of transistors Q1a, Q1b on the one hand, and Q2a, Q2b on the other hand. In the circuit of FIG. 4, they are shown connected to the emitters of the pairs Q'1a, Q'1b and Q'2a, Q'2b.

The circuit according to the invention is intended to allow simultaneous use of the enabling stage and the link crossing stage as explained above. However, it also allows operation according to the prior art modes, if the control of one or other of the switching stages is removed. The operating mode can be chosen according to the desired signal spectrum; the mode according to the invention, using the two switching stages, is the most useful for a spectrum of analog frequencies having components in the second and third Nyquist zones, and even the fourth.

In order to optimize the operation of the converter, it is preferable for the clock to be differential and distributed in all the sections of the converter via a differential binary tree which is balanced in respect of data transfer time (and not only in respect of the physical lengths of the branches) and whose nodes have a debounce damping resistance. The current load of the clock branches distributed in this way may be reduced by fitting repeaters (additional transistors) at various points before each group of switching devices.

The invention claimed is:

1. A digital-to-analog converter having at least a set of current sources, a respective pair of differential branches with two transistors connected to each current source, a register activated at a clock frequency F and receiving a digital data element to be converted, the register controlling the transistors of the pairs of branches to switch the currents from the current sources individually into one or other of the differential branches of each pair as a function of a value of a digital data element to be converted, and two resistive loads receiving currents of the differential branches to produce a differential output electrical signal whose analog value represents the digital data element to be converted, the converter also having a respective switching circuit interposed between a respective pair of differential branches and the loads, said switching circuit comprising an enabling stage and a cross-link stage, said enabling stage configured to enable transmission of the currents of the differential branches toward the loads or to divert said currents of the differential branches away from the loads, wherein:

the enabling stage operates periodically at the clock frequency, the duty cycle between a duration of an enabled transmission and the clock period being in the range from 0.7 to 0.95, the cross-link stage is configured to allow a direct link between the differential branches and the loads, during a first half of said duration of an enabled transmission, and a cross-link between the differential branches and the loads, during a second half of said duration, so as to reverse the sign of the differential output electrical signal between said first and second half of said duration.

2. The converter as claimed in claim 1, wherein the duty cycle is adjustable.

3. The converter as claimed in claim 1, wherein alignment between transition edges of output signals of the enabling circuit and the clock signals is adjustable.

4. The converter as claimed in claim 1, wherein the set of current sources comprises current sources having values weighted according to a binary weighting.

5. The converter as claimed in claim 1, wherein the switching circuit has pairs of transistors associated with each differential branch of a pair to provide symmetrical switching for the currents of the two differential branches, and identical auxiliary current sources are connected to the two differential branches between the switching circuit and a power supply terminal to cause a non-zero current to flow in the pairs of transistors associated with the two differential branches of the pair.

6. The converter as claimed in claim 2, wherein alignment between transition edges of output signals of the enabling circuit and the clock signals is adjustable.

7. The converter as claimed in claim 2, wherein the set of current sources comprises current sources having values weighted according to a binary weighting.

8. The converter as claimed in claim 3, wherein the set of current sources comprises current sources having values weighted according to a binary weighting.

9. The converter as claimed in claim 2, wherein the switching circuit has pairs of transistors associated with each differential branch of a pair to provide symmetrical switching for the currents of the two differential branches, and identical auxiliary current sources are connected to the two differential branches between the switching circuit and a power supply terminal to cause a non-zero current to flow in the pairs of transistors associated with the two differential branches of the pair.

10. The converter as claimed in claim 3, wherein the switching circuit has pairs of transistors associated with each differential branch of a pair to provide symmetrical switching for the currents of the two differential branches, and identical auxiliary current sources are connected to the two differential branches between the switching circuit and a power supply terminal to cause a non-zero current to flow in the pairs of transistors associated with the two differential branches of the pair.

11. The converter as claimed in claim 4, wherein the switching circuit has pairs of transistors associated with each differential branch of a pair to provide symmetrical switching for the currents of the two differential branches, and identical auxiliary current sources are connected to the two differential branches between the switching circuit and a power supply terminal to cause a non-zero current to flow in the pairs of transistors associated with the two differential branches of the pair.

* * * * *